(12) United States Patent
Nishihata et al.

(10) Patent No.: US 10,985,636 B2
(45) Date of Patent: Apr. 20, 2021

(54) SEMICONDUCTOR DEVICE

(71) Applicant: DENSO CORPORATION, Kariya (JP)

(72) Inventors: Masayoshi Nishihata, Kariya (JP); Nobumasa Ueda, Kariya (JP); Hiroki Kiyose, Kariya (JP)

(73) Assignee: DENSO CORPORATION, Kariya (JP)

( * ) Notice: Subject to any disclaimer, the term of this patent is extended or adjusted under 35 U.S.C. 154(b) by 201 days.

(21) Appl. No.: 16/395,481

(22) Filed: Apr. 26, 2019

(65) Prior Publication Data

US 2019/0252954 A1 Aug. 15, 2019

Related U.S. Application Data

(63) Continuation of application No. PCT/JP2017/042497, filed on Nov. 28, 2017.

(30) Foreign Application Priority Data

Feb. 6, 2017 (JP) .............................. JP2017-019663

(51) Int. Cl.
*H02K 11/33* (2016.01)
*H02K 3/50* (2006.01)
(Continued)

(52) U.S. Cl.
CPC .......... *H02K 11/33* (2016.01); *H01L 23/3672* (2013.01); *H01L 23/50* (2013.01);
(Continued)

(58) Field of Classification Search
CPC ...... H02K 11/33; H02K 3/50; H02K 2203/09; H01L 23/367; H01L 23/50; H01L 25/07; H01L 23/49568; H01L 23/49575; H01L 25/18; H01L 23/49562; H01L 25/072; H01L 23/3672; H01L 23/49524; H01L 23/5386; H01L 2224/40245; H02M 2001/008; H02M 7/003; H02M 7/48
See application file for complete search history.

(56) References Cited

U.S. PATENT DOCUMENTS

| 2013/0141871 A1* | 6/2013 | Omae | B62D 5/0406 361/709 |
| 2015/0130076 A1* | 5/2015 | Hino | H01L 24/84 257/774 |
| 2017/0186551 A1* | 6/2017 | Matsumoto | H01G 4/30 |

FOREIGN PATENT DOCUMENTS

| JP | 2011-029262 A | 2/2011 |
| JP | 2011-166847 A | 8/2011 |

(Continued)

*Primary Examiner* — Naishadh N Desai
(74) *Attorney, Agent, or Firm* — Posz Law Group, PLC

(57) ABSTRACT

A semiconductor device includes: a plurality of control modules that controls a rotating electric machine. Each control module includes at least two sets of arms, each set including high-side and low-side switching elements that provide an inverter. A plurality of arms of each control module are coupled in parallel to each other with respect to a bus bar coupled to one power source. Each control module includes a metal plate on which the high-side and low-side switching elements are mounted, and mediates an electric coupling with the power source. Each metal plate includes a first metal plate on which one set of arms is disposed, a second metal plate on which another set of arms is disposed, and a coupling plate that couples the first and second metal plates.

8 Claims, 5 Drawing Sheets

(51) Int. Cl.
 *H01L 23/50* (2006.01)
 *H01L 25/07* (2006.01)
 *H01L 23/367* (2006.01)
 *H01L 25/18* (2006.01)
 *H02M 7/48* (2007.01)

(52) U.S. Cl.
 CPC ............ *H01L 25/07* (2013.01); *H01L 25/072* (2013.01); *H01L 25/18* (2013.01); *H02K 3/50* (2013.01); *H02M 7/48* (2013.01); *H01L 23/367* (2013.01); *H01L 2224/40245* (2013.01); *H02K 2203/09* (2013.01)

(56) References Cited

FOREIGN PATENT DOCUMENTS

| | | |
|---|---|---|
| JP | 5586671 B2 | 9/2014 |
| JP | 2016-163442 A | 9/2016 |
| WO | 2018/142736 A1 | 8/2018 |

* cited by examiner

SEMICONDUCTOR DEVICE

CROSS REFERENCE TO RELATED APPLICATION

The present application is a continuation application of International Patent Application No. PCT/JP2017/042497 filed on Nov. 28, 2017, which designated the U.S. and claims the benefit of priority from Japanese Patent Application No. 2017-19663 filed on Feb. 6, 2017. The entire disclosures of all of the above applications are incorporated herein by reference.

TECHNICAL FIELD

The present disclosure relates to a semiconductor device including a plurality of control modules to control a rotating electric machine.

BACKGROUND

Recently, there is increasing use of a mechatronic rotating electric machine that integrally configures an actuator such as an alternator and a control apparatus to control the actuator. The mechatronic technology can improve control accuracy by combining outputs from the actuator and the control apparatus as modules and enable weight saving and easy installation by eliminating the wire harness. Meanwhile, the control apparatus needs to ensure operations despite the heat generated by itself and the heat from the actuator, requiring high thermal reliability.

SUMMARY

According to an example embodiment, a semiconductor device includes: a plurality of control modules that controls a rotating electric machine. Each control module includes at least two sets of arms, each set including high-side and low-side switching elements that provide an inverter. A plurality of arms of each control module are coupled in parallel to each other with respect to a bus bar coupled to one power source. Each control module includes a metal plate on which the high-side and low-side switching elements are mounted, and mediates an electric coupling with the power source. Each metal plate includes a first metal plate on which one set of arms is disposed, a second metal plate on which another set of arms is disposed, and a coupling plate that couples the first and second metal plates.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
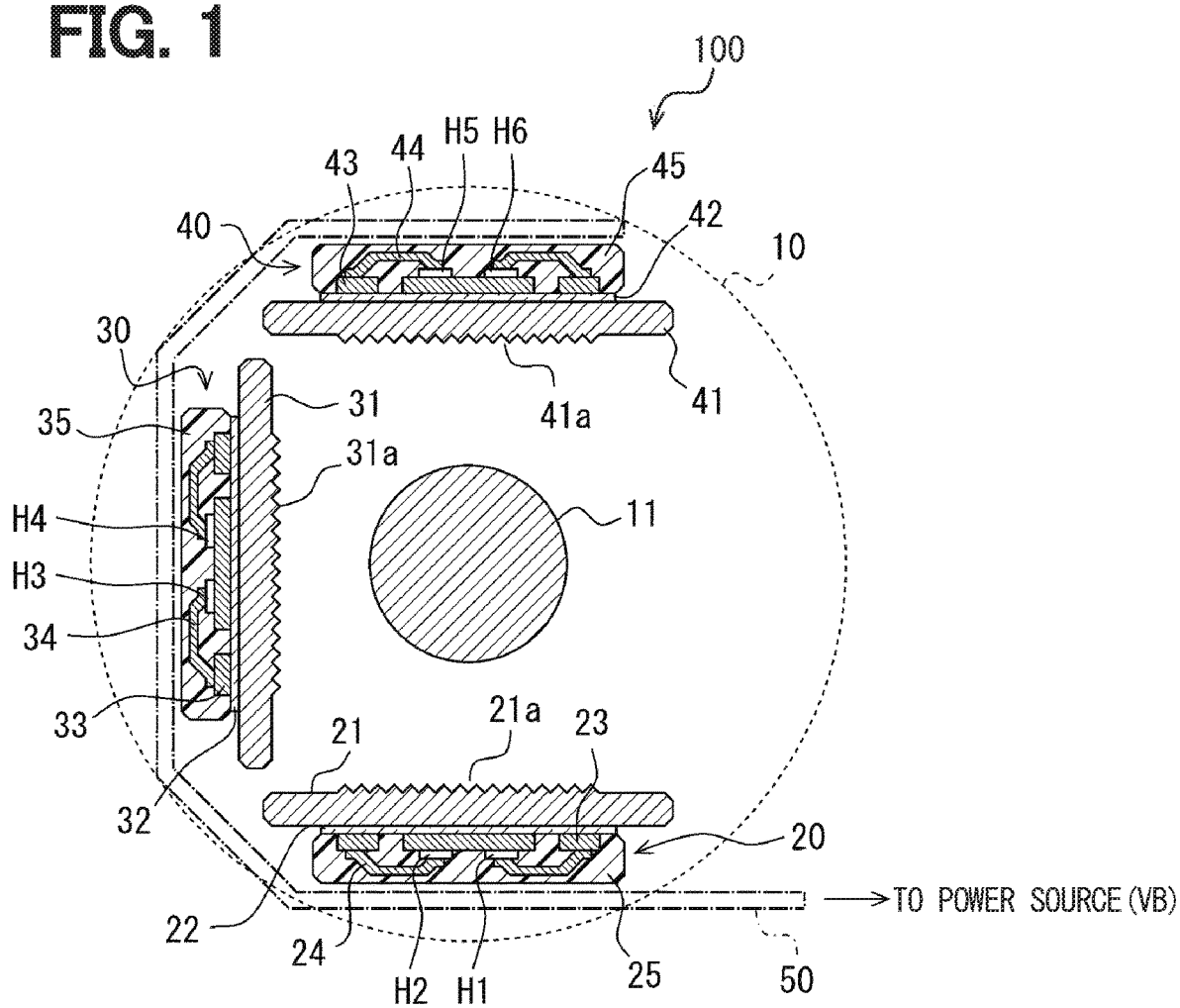
FIG. 1 is a cross-sectional plan view illustrating a schematic configuration of the semiconductor device according to a first embodiment.

For example, a vehicular rotating electric machine includes rectifier modules as control apparatuses circularly placed around a rotary shaft of a motor.

The configuration of circularly placing the modules as the control apparatuses around the rotary shaft of the rotating electric machine may use a mode of coupling each module to one circularly formed bus bar in order to supply a current to the module. This configuration includes a module coupled approximately to the current supply source and a module coupled far from the same. Viewed from the current supply source, approximating to the current supply source decreases a resistance value of the current pathway to each module including the bus bar.

Assuming that a power source for current supply is inadvertently coupled in a manner reverse to a normal coupling, a current flows through a switching element included in the module such as a parasitic diode of MOSFET. Each of the modules corresponding to a low resistance value increases the current. A large current flows through a low-resistance module placed approximately to the power source when eliminating factors such as heat dissipation structures including a stage to mount the modules and the rotating electric machine. The parasitic diode of MOSFET indicates a negative temperature coefficient of resistance. A flow of high current increases the temperature and moreover promotes the resistance reduction. Increasing the current may cause positive feedback. This is unfavorable to the mechatronic semiconductor device.

It is, therefore, a semiconductor device capable of ensuring thermal reliability despite the reverse coupling to a power source is provided.

According to an aspect of example embodiments, a semiconductor device includes: a plurality of control modules to control a rotating electric machine. The plurality of control modules are circularly arranged around a rotary shaft of the rotating electric machine. Each control module includes at least two sets of arms, each set including a high-side switching element and a low-side switching element that provide an inverter. The plurality of control modules are coupled in parallel to each other with respect to a bus bar coupled to one power source, and the at least two sets of arms are coupled in parallel to each other with respect to the bus bar. Each control module includes a metal plate on which the high-side switching element and the low-side switching element are mounted, the metal plate mediating an electric coupling with the power source. Each metal plate includes a first metal plate on which the high-side switching element in one set is disposed, a second metal plate on which the high-side switching element in another set is disposed, and a coupling plate that mutually, electrically and thermally couples the first metal plate and the second metal plate.

According to the above-described semiconductor device, the control module includes arms coupled to the bus bar. When a current caused by a reversely coupled power source flows through the arm nearer to the power source, heat generated at the high-side switching element can be transferred to the high-side switching element belonging to the arm farther from the power source. The metal plate may be mounted with the high-side switching element nearer to the power source. This metal plate increases a heat capacity compared to a configuration void of the coupling plate and improves heat dissipation, making it possible to suppress a temperature increase due to the heat generation.

As above, the high-side switching element nearer to the power source can improve the heat dissipation. The high-side switching element farther from the power source increases a current due to a temperature increase caused by the heat transfer. It is possible to restrain a current due to reverse coupling from concentrating at the high-side switching element nearer to the power source.

The description below explains a plurality of embodiments of the present disclosure with reference to the accompanying drawings. In each embodiment, the same parts or components corresponding to the preceding embodiment are depicted by the same reference symbols and duplicate description may be omitted for simplicity. When only part of a configuration is described in each embodiment, the remaining part of the configuration can reference the preceding embodiment already described. A combination is not limited to parts of each embodiment that are explicitly stated as being capable of the combination. Though not explicitly stated, it is also possible to partially combine the embodiments if the combination is not disadvantageous.

First Embodiment

Figure 2:
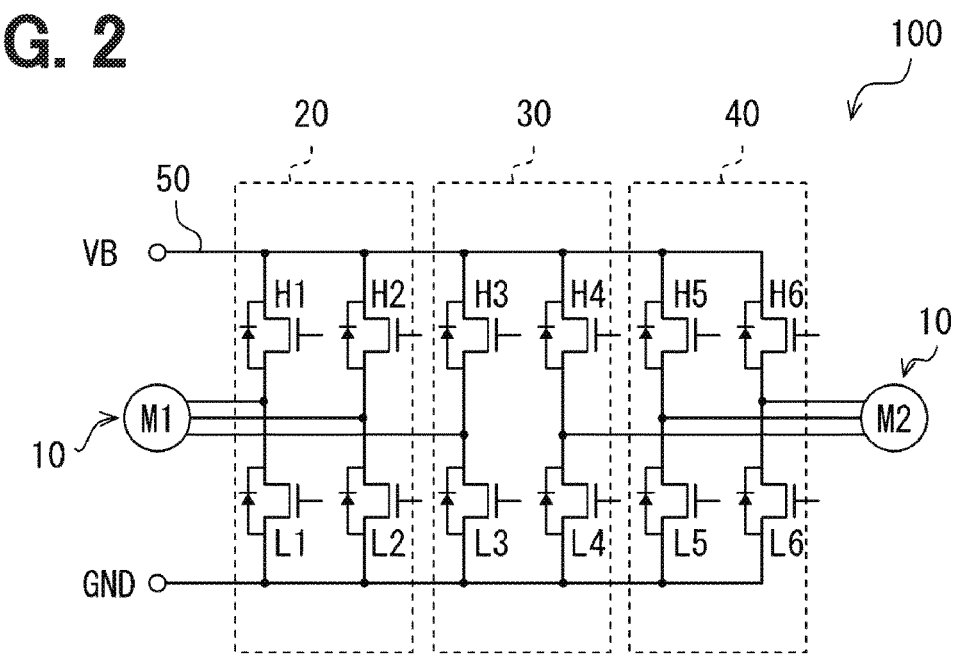
FIG. 2 is a diagram illustrating a circuit configuration of the semiconductor device.
Figure 3:
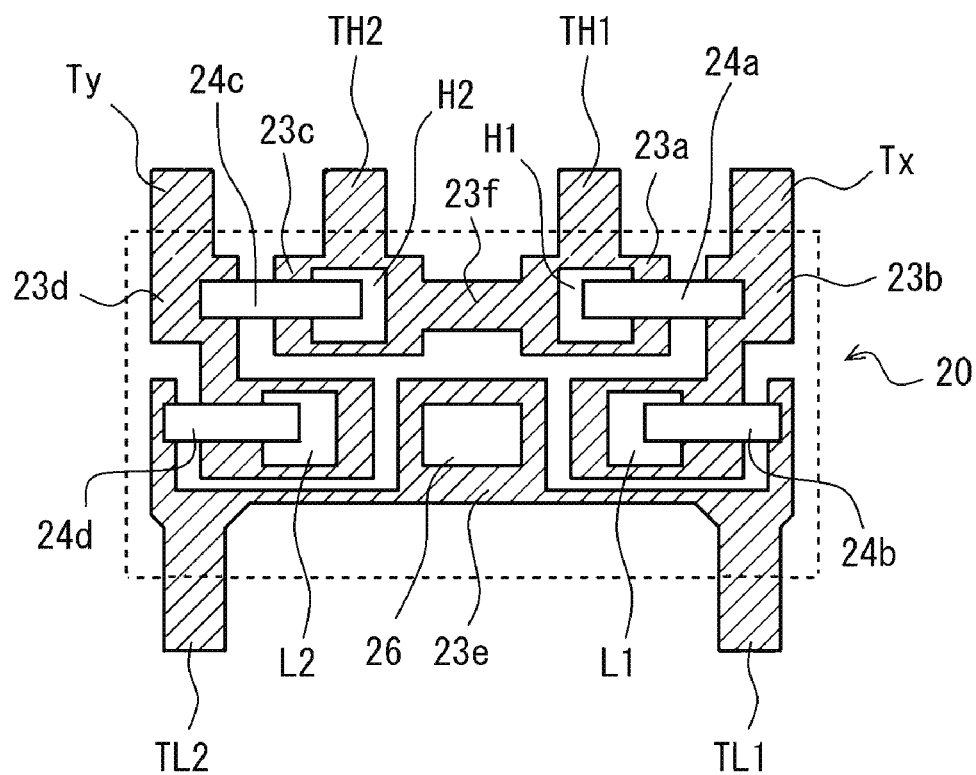
FIG. 3 is a diagram illustrating a detailed configuration of the control module.

With reference to FIGS. 1 through 3, the description below explains a schematic configuration of the semiconductor device according to the present embodiment.

The semiconductor device according to the present embodiment is provided as a mechatronic alternator that integrates the alternator as a rotating electric machine with a control module configuring a rectifier.

As illustrated in FIG. 1, a semiconductor device 100 includes an alternator 10, three control modules 20, 30, and 40, a bus bar 50, and heat radiation plates 21, 31, and 41. The alternator 10 includes a rotor and a stator that are not-shown. The control modules 20, 30, and 40 are placed so as to surround a rotary shaft 11 of the rotor of the alternator 10. The bus bar 50 couples with the control modules 20, 30, and 40. The control modules 20, 30, and 40 are placed on the heat radiation plates 21, 31, and 41.

As illustrated in FIG. 2, the alternator 10 includes the stator and the rotor. The stator includes two sets of 3-phase winding. The rotor includes a rotary shaft. The stator includes an not-shown iron core and stator windings M1 and M2. Specifically, the stator winding M1 is provided as a 3-phase winding including X, Y, and Z phases. The stator winding M2 is provided as a 3-phase winding including U, V, and W phases. The stator winding M2 is placed at an electric angle of 30 degrees shifted from the stator winding M1. The control modules 20, 30, and 40 are provided as rectifiers to control directions of current flow to the stator windings M1 and M2. A total of six arms control current flows to the X, Y, Z, U, V, and W phases.

One end of the bus bar 50 is coupled to the power source to supply a current to the control modules 20, 30, and 40. The control modules 20, 30, and 40 are coupled to the one bus bar 50. As illustrated in FIGS. 1 and 2, the control module 20, the control module 30, and the control module 40 are coupled in the order of vicinity to the power source. The control modules 20, 30, and 40 each function as an inverter and are coupled to the stator windings M1 and M2 configuring the stators.

With reference to FIGS. 1 through 3, the description below explains structures of the control modules 20, 30, and 40 in detail. FIG. 3, though not a sectional view, uses hatching to easily view the state of a metal plate 23.

As illustrated in FIG. 1, the control module 20 includes the metal plate 23, a bridge 24, and a sealing resin 25. The control module 20 includes four MOS transistors H1, L1, H2, and L2 as switching elements to configure an inverter. FIG. 1, as a sectional view, illustrates only H1 and H2 as MOS transistors belonging to the control module 20.

Similarly, the control module 30 includes a metal plate 33, a bridge 34, and a sealing resin 35. The control module 30 includes four MOS transistors H3, L3, H4, and L4 as switching elements to configure an inverter. Similarly, the control module 40 includes a metal plate 43, a bridge 44, and a sealing resin 45. The control module 40 includes four MOS transistors H5, L5, H6, and L6 as switching elements to configure an inverter.

The three control modules 20, 30, and 40 include composing elements comparable to each other except their physical arrangements and structures of the switching elements designed to intentionally use different resistance values. The one control module 20 is used as an example to explain the structure in detail.

As illustrated in FIG. 2, the control module 20 is assigned two arms out of six and controls a current supply to the X and Y phases. The control module 20 allows a first arm to include a MOS transistor H1 at the high side and a MOS transistor L1 at the low side. These are serially coupled to power source VB. An intermediate point between the MOS transistor H1 and the MOS transistor L1 is coupled to the stator winding M1 to form the X phase. Similarly, the control module 20 allows a second arm to include a MOS transistor H2 at the high side and a MOS transistor L2 at the low side. These are serially coupled to power source VB. An intermediate point between the MOS transistor H2 and the MOS transistor L2 is coupled to the stator winding M1 to form the Y phase. The first arm and the second arm are coupled to the power source in parallel.

The MOS transistor H1 is comparable to a first high-side switching element. The MOS transistor L1 is comparable to a first low-side switching element. The MOS transistor H2 is comparable to a second high-side switching element. The MOS transistor L2 is comparable to a second low-side switching element.

The control module 20 is mounted as illustrated in FIG. 3 in order to provide the above-described coupling. The metal plate 23 includes a first metal plate 23a, a second metal plate 23b, a third metal plate 23c, a fourth metal plate 23d, and a fifth metal plate 23e. These are separately formed on the same plane. The bridge 24 includes a first bridge 24a, a second bridge 24b, a third bridge 24c, and a fourth bridge 24d.

The first metal plate 23a is mounted with the high-side MOS transistor H1 and is electrically coupled to a drain terminal. A terminal TH1 extends from the first metal plate 23a and is coupled to the bus bar 50. Namely, the terminal TH1 is provided as a positive terminal for the first arm.

The second metal plate 23b is mounted with the low-side MOS transistor L1 and is electrically coupled to a drain terminal and is coupled to a source terminal of the high-side MOS transistor H1 via the first bridge 24a. A terminal Tx extends from the second metal plate 23b and is coupled to the stator winding M1. The terminal Tx provides an output terminal corresponding to the X phase.

The third metal plate 23c is mounted with the high-side MOS transistor H2 and is electrically coupled to a drain terminal. A terminal TH2 extends from the third metal plate 23c and is coupled to the bus bar 50. Namely, the terminal TH2 is provided as a positive terminal for the second arm.

The fourth metal plate 23d is mounted with the low-side MOS transistor L2 and is electrically coupled to a drain terminal and is coupled to a source terminal of the high-side MOS transistor H2 via the third bridge 23c. A terminal Ty extends from the fourth metal plate 23d and is coupled to the stator winding M1. The terminal Ty provides an output terminal corresponding to the Y phase.

The fifth metal plate 23e is coupled to a source terminal of the MOS transistor L1 via the second bridge 24b and is coupled to a source terminal of the MOS transistor L2 via the fourth bridge 24b. A terminal TL1 and a terminal TL2 extend from the fifth metal plate 23a and are coupled to the bus bar set to a GND potential. The terminal TL1 provides a negative electrode terminal for the first arm. The terminal TL2 provides a negative electrode terminal for the second arm. These are set to the same potential at the fifth metal plate 23e. For example, a current flowing through the first arm is highly likely to traverse the terminal TL2. In this case, however, the main current pathway for the first arm corresponds to the pathway between TH1 and TL1 where the resistance value further decreases.

The fifth metal plate 23e is mounted with a control IC 26 to control switching over the MOS transistors H1, H2, L1, and L2. Though not illustrated in FIG. 3, the control IC 26 is coupled to the MOS transistors H1, H2, L1, and L2 by using bonding wires. In the control module 20, the metal plate 23, the bridge 24, and the MOS transistors H1, H2, L1, and L2 are placed so as to be approximately bilaterally symmetric on an arm basis. Correspondingly, the terminals TH1, TL1, TH2, and TL2 are also placed so as to be approximately bilaterally symmetric.

According to the present embodiment, the first metal plate 23a and the third metal plate 23c are coupled to each other via a coupling plate 23f. Namely, the first metal plate 23a, the third metal plate 23c, and the coupling plate 23f are formed into an integrated plate. The coupling plate 23f provides thermal and electric coupling between the first metal plate 23a and the third metal plate 23c. When one of the high-side MOS transistors H1 and H2 is heated excessively, the heat is transferred to the metal plate where the other MOS transistor is mounted. The coupling plate 23f according to the present embodiment is made of the same metal material as the first metal plate 23a and the third metal plate 23c but is not limited thereto. However, it is favorable to use a material indicating a higher thermal conductivity than a material used for an insulation layer 22 to be described later.

The sealing resin 25 seals the MOS transistors H1, H2, L1, and L2, and the metal plate 23 so as to cover them. One surface of the metal plate 23 is not mounted with the MOS transistors H1, H2, L1, and L2 and is exposed from the sealing resin 25. The control module 20 is placed over the heat radiation plate 21 via the insulation layer 22 so that one surface of the metal plate 23 exposed from the sealing resin 25 faces the heat radiation plate 21. The heat generated from the MOS transistors H1, H2, L1, and L2 transfers and dissipates to the heat radiation plate 21 via the metal plate 23 and the insulation layer 22. A radiation fin 21a is formed over the surface that is not mounted with the control module 20 in the heat radiation plate 21.

As illustrated in FIG. 1, the metal plate 23 according to the present embodiment is thicker than the insulation layer 22. Therefore, the coupling plate 23f is thicker than the insulation layer 22.

As above, the control module 30 also includes composing elements similar to those of the control module 20. Namely, the metal plate 33 divided into fifths is appropriately mounted with the high-side MOS transistors H3 and H4, the low-side MOS transistors L3 and L4, and the control IC. The arm comprised of the MOS transistors H3 and L3 provides a Z phase for the stator winding M1. The arm comprised of the MOS transistors H4 and L4 provides a U phase for the stator winding M2. A heat radiation plate 31 includes a radiation fin 31a. The metal plate 33 of the control module 30 also includes a coupling plate between the metal plate mounted with the high-side MOS transistor H3 and the metal plate mounted with the MOS transistor H4. Both are coupled thermally and electrically.

The control module 40 also includes composing elements similar to those of the control module 20. Namely, the metal plate 43 divided into fifths is appropriately mounted with the high-side MOS transistors H5 and H6, the low-side MOS transistors L5 and L6, and the control IC. The arm comprised of the MOS transistors H5 and L5 provides a V phase for the stator winding M2. The arm comprised of the MOS transistors H6 and L6 provides a W phase for the stator winding M2. A heat radiation plate 41 includes a radiation fin 41a. The metal plate 43 of the control module 40 also includes a coupling plate between the metal plate mounted with the high-side MOS transistor H5 and the metal plate mounted with the MOS transistor H6. Both are coupled thermally and electrically.

As illustrated in FIG. 1, the control modules 20, 30, and 40 are circularly placed so as to surround the rotary shaft 11. The control modules 20, 30, and 40 are placed so that the surfaces to mount the heat radiation plates 21, 31, and 41 are aligned in the rotary shaft direction. The heat radiation plate 21 and the heat radiation plate 41 are placed so that the radiation fin 21a and the radiation fin 41a face to each other. The heat radiation plate 31 is placed to be orthogonal to the heat radiation plate 21 and the heat radiation plate 41. Namely, the heat radiation plates 21, 31, and 41 are circularly placed so that the radiation fins face the rotary shaft 11. The control modules 20, 30, and 40 adhere to the surfaces where no radiation fin is formed. In this mode, terminals extending from the metal plates 23, 33, and 43 are placed in a U-shaped form. Therefore, the bus bar 50 is also bent into a U-shaped form.

The description below explains operations and effects of using the semiconductor device 100 according to the present embodiment.

For example, it is supposed that the power source is reversely coupled to the semiconductor device 100. Namely, it is supposed that the bus bar originally configured to be a GND potential goes to a higher potential than the bus bar 50 originally configured to be a VB potential.

As illustrated in FIG. 2, a parasitic diode occurs in the MOS transistor in the forward direction from the source terminal to the drain terminal. If the power source is reversely coupled, a current flows via the parasitic diode. Namely, the current flows from the low-side MOS transistor to the high-side MOS transistor. This current heats the MOS transistor. The parasitic diode has a negative temperature coefficient of resistance. Heat generation further promotes resistance reduction. Therefore, more current flows to increase the amount of heat generation.

Of the control modules 20, 30, and 40 coupled to the bus bar 50, the control module 20 is most approximate to the power source. The control module 20 indicates the lowest electric resistance viewed from the power source because the control module 20 actually requires the shortest length of the bus bar 50. Therefore, the current due to the reversely coupled power source easily flows to the control module 20. The description here concerns the operations and effects of the control module 20. However, the control module 30 and the control module 40 provide similar operations and effects. Inside the control module 20 as illustrated in FIG. 2, the MOS transistor H1 configuring the first arm is nearer to the power source than the MOS transistor H2 configuring the second arm and indicates a small electric resistance value viewed from the power source.

Immediately after the power source is coupled reversely, the current starts flowing through the MOS transistor H1 and the MOS transistor H2 via the parasitic diode. The MOS transistor H1 indicates a larger current value than the MOS transistor H2 corresponding to a difference in electric resistance values viewed from the power source. The heat generation from the MOS transistor H1 increases the temperature of the MOS transistor H1.

In the control module 20 according to the present embodiment as illustrated in FIG. 3, the coupling plate 23f thermally couples the first metal plate 23a to mount the MOS transistor H1 with the third metal plate 23c to mount the MOS transistor H2. The heat generated from the MOS transistor H1 is transferred to the MOS transistor H2 via the coupling plate 23f. The heat generated from the MOS transistor H1 transfers and dissipates to not only the first metal plate 23a but also the third metal plate 23c and the coupling plate 23f. It is possible to restrain the MOS transistor H1 from increasing the temperature compared to a configuration that lacks the coupling plate 23f.

The heat transfer increases the temperature of the MOS transistor H2 and decreases the resistance value. Namely, more current flows through the MOS transistor H2. A current due to the reverse coupling can be applied to not only the MOS transistor H1 but also the MOS transistor H2. It is possible to restrain a current from concentrating at the one high-side MOS transistor and restrain excessive heat generation in the MOS transistor H1. The MOS transistor H1 and the MOS transistor H2 can maintain approximately the same temperature after a lapse of a certain amount of time. It is possible to restrain an excess current from concentrating at only one of the MOS transistors.

As above, it is possible to ensure the thermal reliability of the control modules 20, 30, and 40 even if the power source is inadvertently coupled reversely.

The coupling plate 23f according to the present embodiment is made of metal and has a higher thermal conductivity than the insulation layer 22. The coupling plate 23f is thicker than the insulation layer 22. When the MOS transistor H1 generates heat, the amount of heat transferred to the insulation layer 22 is larger than the amount of heat transferred to the insulation layer 23f. This makes it possible to configure a situation capable of easily distributing a current as soon as possible from the time of reversely coupling the power source and therefore further improve the thermal reliability of the control modules 20, 30, and 40.

First Modification

Figure 4:
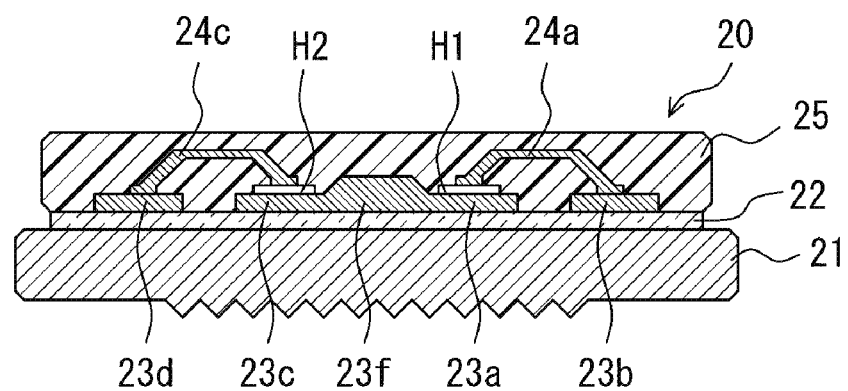
FIG. 4 is a cross-sectional view illustrating a schematic configuration of the semiconductor device according to a first modification.

The above-described embodiment has described the mode in which the whole of the metal plate 23 is thicker than the insulation layer 22. As illustrated in FIG. 4, however, only the coupling plate 23f may be configured to be thick.

This configuration thickens only the coupling plate 23f without thickening the whole of the control module 20. The configuration provides the same effect as the first embodiment, namely, transferring the heat generated from the MOS transistor H1 to the coupling plate 23f in preference to the insulation layer 22. In addition, the use of this mode can restrain the thickness of the control module 20. It is possible to embody the semiconductor device 100 in a restrained size while ensuring thermal reliability of the semiconductor device 100 even in a configuration that can afford a limited space to mount the control modules 20, 30, and 40.

Figure 5:
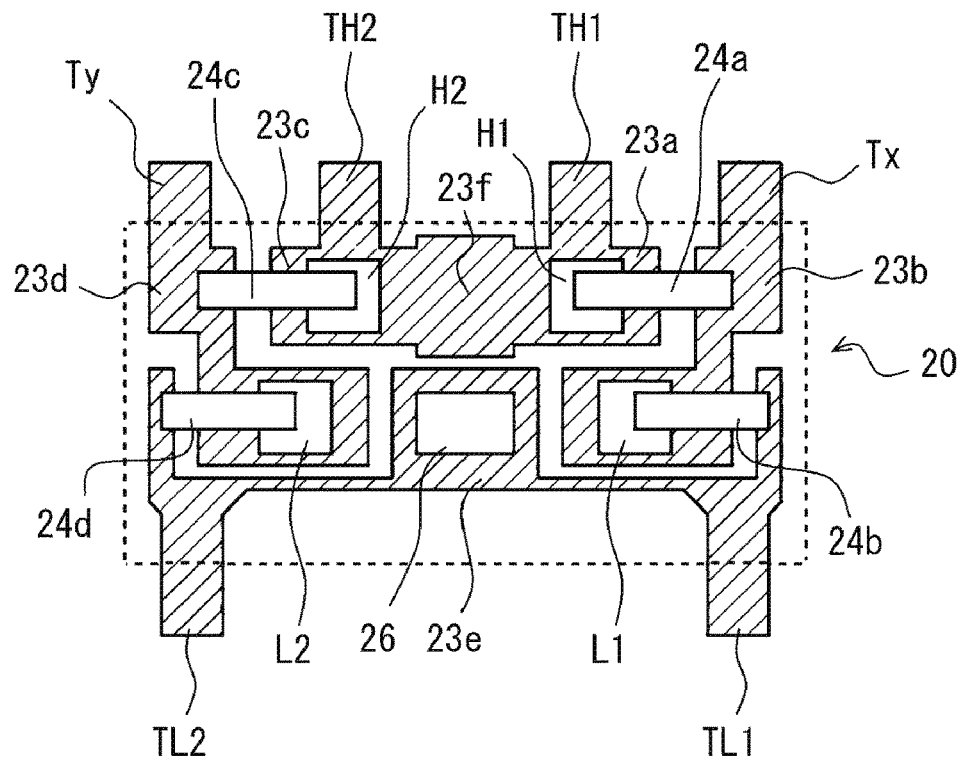
FIG. 5 is a diagram illustrating a detailed configuration of the control module according to the first modification.

It is possible to improve the heat-transfer effect due to the coupling plate 23f even under the condition of increasing the width in the direction along the surface of the coupling plate 23f as illustrated in FIG. 5.

Second Modification

The present embodiment also describes the control module according to a so-called 4in1-configuration that places four MOS transistors in each of the control modules 20, 30, and 40. FIG. 2 illustrates a circuit configuration as described in the first embodiment. The description of the first embodiment also applies to the placement and shapes of the alternator 10 and the heat radiation plates 21 through 41.

According to the first embodiment and the first modification, the positive electrode terminal forms the terminal TH1 corresponding to the first arm and the terminal TH2 corresponding to the second arm. The negative electrode terminal forms the terminal TL1 corresponding to the first arm and the terminal TL2 corresponding to the second arm.

Figure 6:
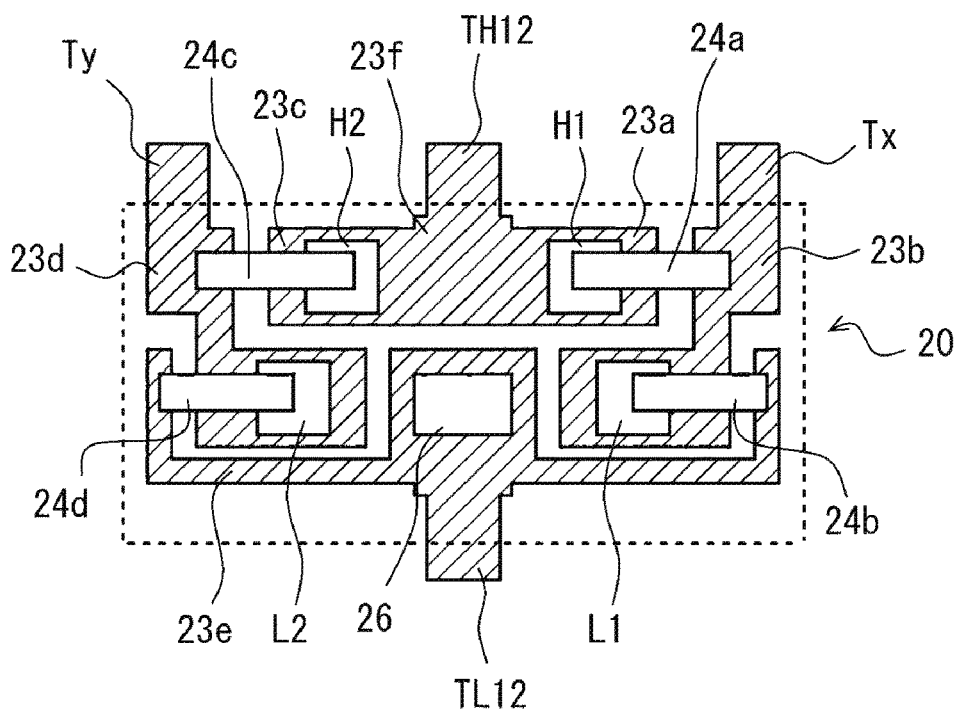
FIG. 6 is a diagram illustrating a detailed configuration of the control module according to a second embodiment.

Meanwhile, as illustrated in FIG. 6, the control modules 20, 30, and 40 according to the present embodiment include only one positive electrode terminal TH12 corresponding to the first arm and the second arm and only one negative electrode terminal TL12 corresponding to the first arm and the second arm.

The positive electrode terminal TH12 is positioned approximately in the middle of the positions to install the MOS transistor H1 and the MOS transistor H2. Namely, the positive electrode terminal TH12 extends from the coupling plate 23f to the outside of the control module 20.

The negative electrode terminal TL12 is positioned approximately in the middle of the positions to install the MOS transistor L1 and the MOS transistor L2. Namely, the negative electrode terminal TL12 extends from the vicinity of the position to mount the control IC 26 in the fifth metal plate 23e to the outside of the control module 20. The negative electrode terminal TL12 extends in a direction opposite the direction of extending the positive electrode terminal TH12.

As described in the first embodiment, the metal plate 23, the bridge 24, and the MOS transistors H1, H2, L1, and L2 in the control module 20 are placed so as to be approximately bilaterally symmetric on an arm basis. The positive electrode terminal TH12 and the negative electrode terminal TL12 are placed approximately in the middle of the first arm and the second arm and the whole is thereby approximately bilaterally symmetric.

In the control module 20 according to the present embodiment, the positive electrode terminal TH12 functions as both the terminal TH1 and the terminal TH2 according to the first embodiment. Similarly, the negative electrode terminal TL12 functions as both the terminal TL1 and the terminal TL2 according to the first embodiment.

The control module 30 and the control module 40 are structured to be approximately comparable to the control module 20. Each control module includes one positive electrode terminal and one negative electrode terminal.

The use of the control modules 20, 30, and 40 according to the present embodiment can provide the first arm and the second arm with approximately the same resistance value between the positive electrode terminal TH12 and the negative electrode terminal TL12. This makes it possible to prevent the reversely coupled power source from applying much current to one of the arms in the control module 20, for example. Therefore, it is possible to restrain the uneven distribution of the heat source in the control module 20 and improve thermal reliability.

As above, it is favorable to position the positive electrode terminal TH12 and the negative electrode terminal TL12 approximately in the middle of the first arm and the second arm for the purpose of providing the current pathway with approximately the same resistance value. However, the positive electrode terminal TH12 and the negative electrode terminal TL12 need not be positioned exactly in the middle of the first arm and the second arm. The positive electrode terminal TH12 and the negative electrode terminal TL12 may be positioned between the first arm and the second arm. This makes it possible to approximate resistance values for the current pathway to the same value and restrain the uneven distribution of the heat source compared to the mode described in the first embodiment and the first modification. There may be a case where the positive electrode terminal TH12 and the negative electrode terminal TL12 cannot be positioned approximately in the middle of the first arm and the second arm due to an interference of other not-shown members. In such a case, it may be favorable to slightly change the positions to form the terminals.

Third Embodiment

As above, the first embodiment and the second embodiment have described the examples of the semiconductor device 100 including the three control modules 20, 30, and 40 that comply with the 4in1 configuration. The control module is not limited to the 4in1 configuration and just needs to include at least two sets of arms. The present embodiment describes a control module according to a 6in1 configuration. The control module according to the 6in1 configuration includes six MOS transistors to configure three sets of arms in one module.

A circuit configuration of a semiconductor device 110 is similar to that described in the first embodiment and is illustrated in FIG. 2. The description of the first embodiment also applies to the configuration of the alternator 10.

Figure 7:
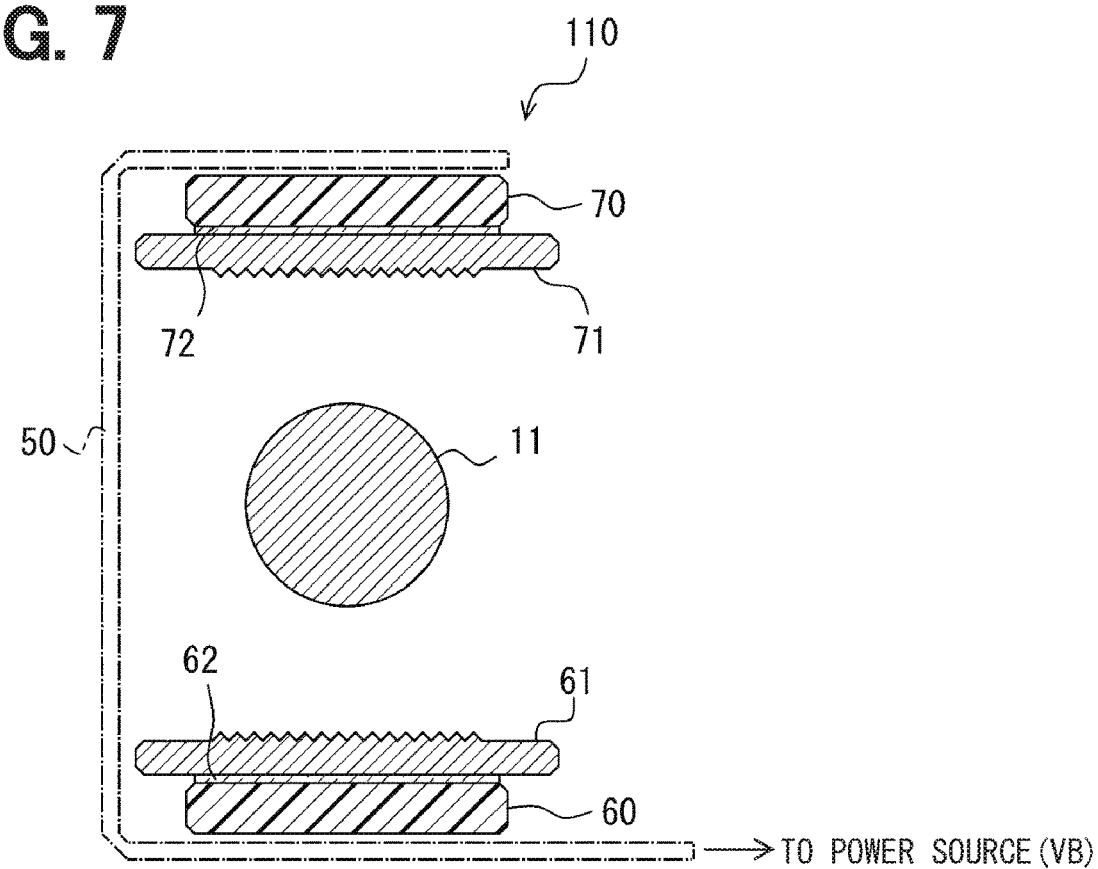
FIG. 7 is a cross-sectional plan view illustrating a schematic configuration of the semiconductor device according to a third embodiment.

In the semiconductor device 110 according to the present embodiment as illustrated in FIG. 7, two control modules 60 and 70 are bonded to heat radiation plates 61 and 71 and are placed to sandwich the rotary shaft 11. The control module 60 includes the high-side MOS transistors H1, H2, and H3 and the low-side MOS transistors L1, L2, and L3, for example. The control module 70 includes the high-side MOS transistors H4, H5, and H6 and the low-side MOS transistors L4, L5, and L6, for example. The control module 60 is bonded to a heat radiation plate 61 via an insulation layer 62. The control module 70 is bonded to a heat radiation plate 71 via an insulation layer 72.

Figure 8:
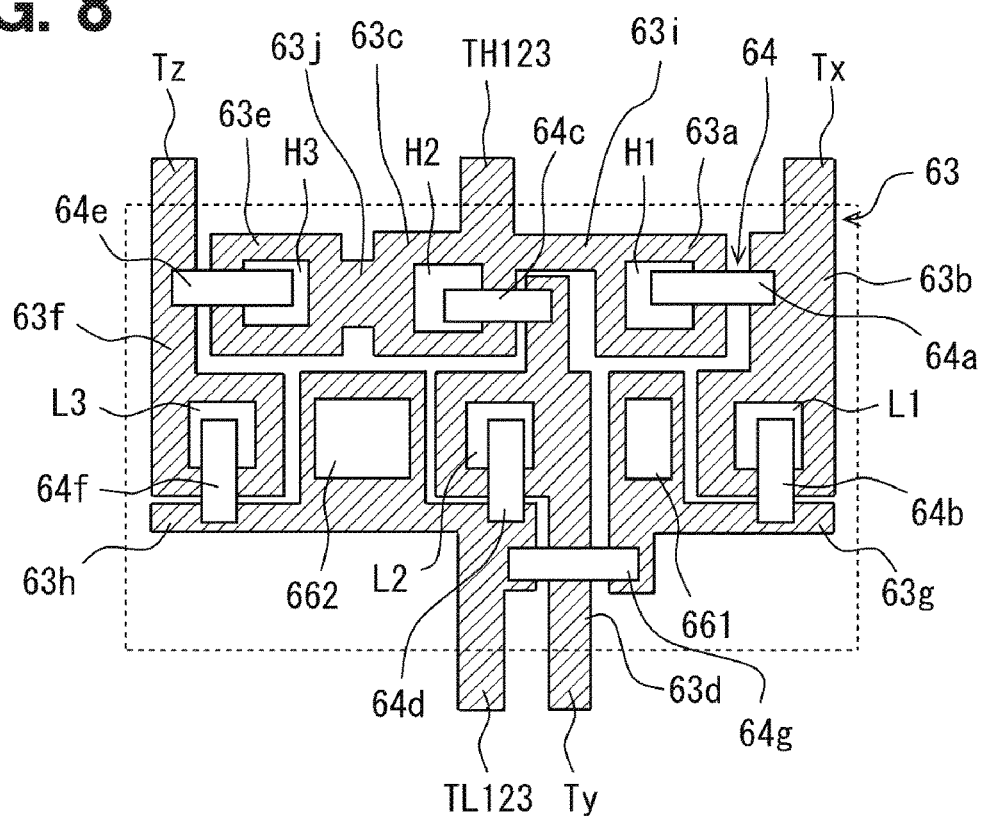
FIG. 8 is a diagram illustrating a detailed configuration of the control module.

With reference to FIG. 8, the description below explains detailed structures of the control modules 60 and 70 according to the 6in1 configuration. The two control modules 60 and 70 include composing elements comparable to each other except their physical arrangements and structures of the switching elements designed to intentionally use different resistance values. The description here uses one control module 60 as an example.

As illustrated in FIG. 8, the control module 60 in the semiconductor device 110 includes the high-side MOS transistors H1, H2, and H3, the low-side MOS transistors L1, L2, and L3, a metal plate 63, and a bridge 64. The MOS transistor H3 is comparable to a third high-side switching element. The MOS transistor L3 is comparable to a third low-side switching element.

The metal plate 63 includes a first metal plate 63a, a second metal plate 63b, a third metal plate 63c, a fourth metal plate 63d, a fifth metal plate 63e, a sixth metal plate 63f, a seventh metal plate 63g, and an eighth metal plate 63h. These are independently formed over the same plane. The bridge 64 includes a first bridge 64a, a second bridge 64b, a third bridge 64c, a fourth bridge 64d, a fifth bridge 64e, a sixth bridge 64f, and a seventh bridge 64g.

The first metal plate 63a is mounted with the high-side MOS transistor H1 and is electrically coupled to a drain terminal.

The second metal plate 63b is mounted with the low-side MOS transistor L1 and is electrically coupled to a drain terminal and is coupled to a source terminal of the high-side MOS transistor H1 via the first bridge 64a. A terminal Tx extends from the second metal plate 63b and is coupled to the stator winding M1. The terminal Tx provides an output terminal corresponding to the X phase. The MOS transistor H1 and the MOS transistor L1 configure the first arm.

The third metal plate 63c is mounted with the high-side MOS transistor H2 and is electrically coupled to a drain terminal. A terminal TH123 extends from the third metal plate 63c and is coupled to the bus bar 50. As will be described later, the terminal TH123 provides a positive electrode terminal common to the first through third arms.

The fourth metal plate 63d is mounted with the low-side MOS transistor L2 and is electrically coupled to a drain terminal and is coupled to a source terminal of the high-side MOS transistor H2 via the third bridge 64c. A terminal Ty extends from the fourth metal plate 63d and is coupled to the stator winding M1. The terminal Ty provides an output terminal corresponding to the Y phase. The MOS transistor H2 and the MOS transistor L2 configure a second arm.

The fifth metal plate 63e is mounted with the high-side MOS transistor H3 and is electrically coupled to a drain terminal.

The sixth metal plate 63f is mounted with the low-side MOS transistor L3 and is electrically coupled to a drain terminal and is coupled to a source terminal of the high-side MOS transistor H3 via the fifth bridge 64e. A terminal Tz extends from the sixth metal plate 63f and is coupled to the stator winding M1. The terminal Tz provides an output terminal corresponding to the Z phase. The MOS transistor H3 and the MOS transistor L3 configure a third arm.

The seventh metal plate 63g is coupled to a source terminal of the MOS transistor L1 via the second bridge 64b and is mounted with a control IC 661 to control switching over the MOS transistors H1 and L1. Though not illustrated in FIG. 8, the control IC 661 is coupled to the MOS transistors H1 and L1 by using bonding wires.

The eighth metal plate 63h is coupled to a source terminal of the MOS transistor L2 via the fourth bridge 64d and is coupled to a source terminal of the MOS transistor L3 via the sixth bridge 64f. The seventh metal plate 63g is coupled to the eighth metal plate 63h via the seventh bridge 64g and is set to the same potential. The terminal TH123 extends from the eighth metal plate 63h and is coupled to the bus bar set to the GND potential. The terminal TH123 provides a negative electrode terminal common to the first through third arms.

The eighth metal plate 63h is mounted with a control IC 662 to control switching over the MOS transistors H2, H3, L2, and L3. Though not illustrated in FIG. 8, the control IC 662 is coupled to the MOS transistors H2, H3, L2, and L3 by using bonding wires. In the control module 60, the metal plate 63, the bridge 64, and the MOS transistors H1, H2, H3, L1, L2, and L3 are placed so as to be approximately bilaterally symmetric on an arm basis.

According to the present embodiment, the first metal plate 63a and the third metal plate 63c are coupled to each other via the coupling plate 63i. The third metal plate 63c and the fifth metal plate 63e are coupled to each other via the coupling plate 63j.

Namely, the first metal plate 63a, the third metal plate 63c, the fifth metal plate 63e, the coupling plate 63i, and the coupling plate 63j are formed into an integrated plate. The coupling plate 63i provides thermal and electric coupling between the first metal plate 63a and the third metal plate 63c. The coupling plate 63j provides thermal and electric coupling between the third metal plate 63c and the fifth metal plate 63e.

When one of the high-side MOS transistors H1, H2, and H3 is heated excessively, the heat is transferred to the metal plate where any of the other high-side MOS transistors is mounted. The heat generated from the MOS transistor H1 transfers and dissipates to not only the first metal plate 63a but also the third metal plate 63c, the fifth metal plate 63e, the coupling plate 63i, and the coupling plate 63j. It is possible to restrain the MOS transistor H1 from increasing the temperature compared to a configuration that lacks the coupling plates 63i and 63j.

A current due to the reverse coupling can be applied to not only the MOS transistor H1 but also the MOS transistors H2 and H3 that increase the temperature due to the heat transfer. It is possible to restrain a current from concentrating at the one high-side MOS transistor.

The coupling plates 63i and 63j according to the present embodiment are made of the same metal material as the third metal plate 63c and the fifth metal plate 63e but are not limited thereto. However, it is favorable to use a material indicating a higher thermal conductivity than a material used for the insulation layer 62.

The coupling plates 63i and 63j provide the same potential for the first metal plate 63a, the third metal plate 63c, and the fifth metal plate 63e. The terminal TH123 formed for the third metal plate 63c provides a positive electrode terminal common to the first through third arms. As formed for the third metal plate 63c, the terminal TH123 is formed near the MOS transistor H2 and is positioned approximately in the middle of the positions to install the MOS transistor H1 and the MOS transistor H3. Meanwhile, the negative electrode terminal TL12 is formed approximately in the middle of the positions to install the MOS transistor L1 and the MOS transistor L3 and is formed near the MOS transistor L2. The negative electrode terminal TL123 extends in a direction opposite the direction of extending the positive electrode terminal TH123. The control module 70 is structured to be approximately comparable to the control module 60. The control module 70 includes one positive electrode terminal and one negative electrode terminal.

The use of the control modules 60 and 70 according to the present embodiment can allow the first, second, and third arms to ensure approximately the same resistance value for the current pathway between the positive electrode terminal TH123 and the negative electrode terminal TL123. This makes it possible to prevent the reversely coupled power source from applying much current to one of the arms in the control module 60, for example. Therefore, it is possible to restrain the uneven distribution of the heat source in the control module 60 and improve thermal reliability.

Second Modification

As illustrated in the third embodiment, the control modules 60 or 70 according to the 6in1 configuration allows one control module to includes three arms. Therefore, one arm is sandwiched between two arms. For example, the control module 60 allows the second arm to be sandwiched between the first arm and the third arm. In this mode, the second arm sandwiched in between is positioned approximately at the center of the metal plate 63. The center part of the metal plate 63 provides higher heat dissipation than the end part of the metal plate 63 where the first arm or the third arm is mounted. In other words, the second arm provides a high current withstand capability against the heat.

Figure 9:
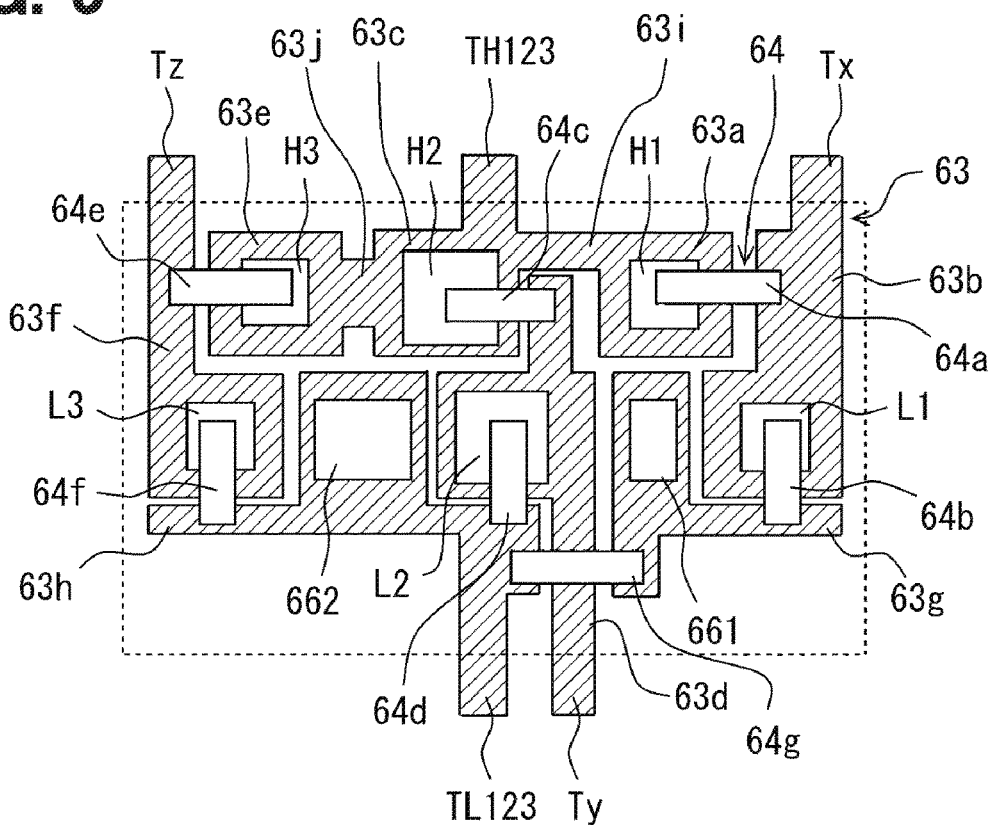
FIG. 9 is a diagram illustrating a detailed configuration of the control module according to a second modification.

The amount of current for the second arm may be intentionally increased by providing the second arm with an electric resistance value smaller than that given to the first arm and the third arm. Specifically, as illustrated in FIG. 9, the high-side MOS transistor H2 and the low-side MOS transistor L2 in the second arm each use an effective cell region whose area is larger than those of the MOS transistors H1, H3, L1, and L3. Concerning a trench-type MOS transistor, for example, the effective cell region forms one surface of a semiconductor substrate, exposes a source region, applies a voltage to the trench gate to generate a channel, and contributes to conduction of a drain current. Increasing the effective cell region decreases the resistance value of the MOS transistor.

As above, a current is positively applied to the second arm characterized by the high heat dissipation. This makes it possible to decrease the amount of current for the first arm and the third arm and restrain the heat generation. It is also possible to effectively dissipate the heat generated from the second arm. Therefore, it is possible to restrain the excessive heat generation in the control module 60 and improve thermal reliability.

Other Embodiments

There have been described the preferred embodiments of the present disclosure. However, the disclosure is not limited to the above-mentioned embodiments but may be otherwise variously modified within the spirit and scope disclosed in this specification.

The above-described embodiments and modifications have described examples of using the MOS transistor as a switching element included in the control module. However, the switching element may be available as an insulated gate bipolar transistor (IGBT) or other semiconductor switching elements.

The above-described embodiments and modifications have described examples of using the 3-phase winding for the stator windings M1 and M2. However, the number of phases is not limited. Accordingly, the number of control modules needs to be changed as appropriate.

The above-described embodiments and modifications have described examples of increasing an area of the effective cell region for the switching element as a means for reducing the resistance of the control module. However, the means for the resistance reduction is not limited thereto. For example, it may be possible to reduce the resistance by changing composing materials for the metal plate 23 or 63 or changing components of an electrically conductive adhesive (such as solder) used for electrical coupling. However, changing an area of the effective cell region for the switching element is easy and provides a profound effect compared to changing composing materials for the metal plate 23 or 63 or changing components of an electrically conductive adhesive.

Figure 10:
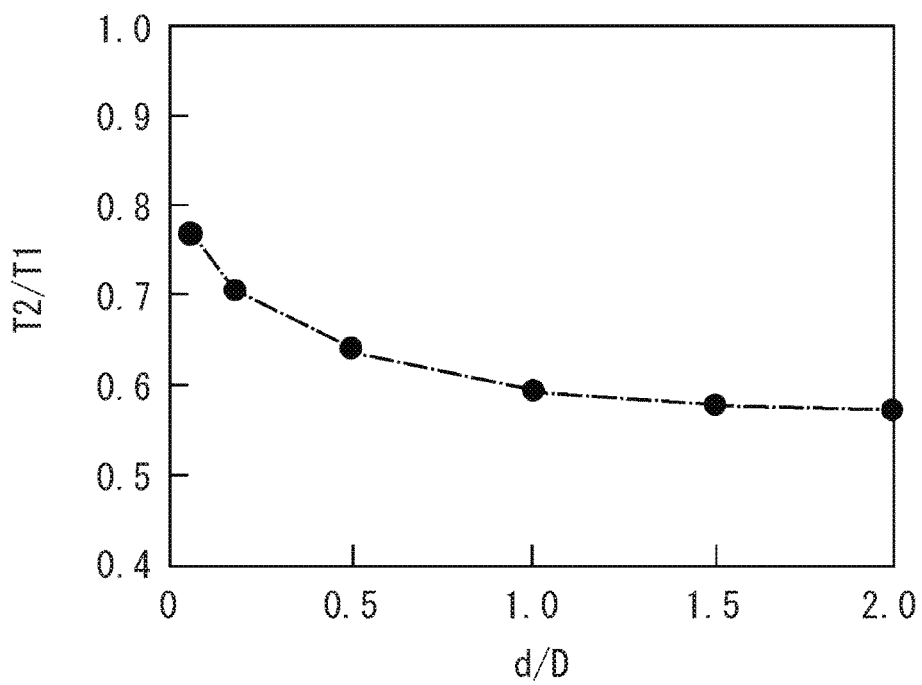
FIG. 10 is a diagram illustrating a relationship between ratio T2/T1 and ratio d/D, where T1 and T2 denote temperatures of high-side switching elements, D denotes the thickness of a coupling plate, and d denotes the thickness of an insulation layer.

The inventors used computer simulation to determine the thickness of the coupling plate 23f, 63i, or 63j with reference to the thickness of the insulation layer 22 or 62. FIG. 10 illustrates a result of investigating the relationship between ratio T2/T1 and ratio d/D, where T1 denotes the temperature of a high-side switching element, T2 denotes the temperature of an adjacent high-side switching element, D denotes the thickness of a coupling plate, and d denotes the thickness of an insulation layer in the 4in1-configuration control module as illustrated in FIG. 1 or 4. The temperature ratio T2/T1 for the elements almost always approximates to 0.6 under the condition of d>D where the insulation layer is thicker than the coupling plate. The heat significantly transfers to the adjacent switching element under the condition of d<D where the coupling plate is thicker than the insulation layer. Therefore, it is favorable to configure the coupling plate to be thicker than the insulation layer.

Shortening a mounting distance between adjacent high-side switching elements improves the heat transfer therebetween. For example, the 4in1-configuration control module 20 according to the first embodiment can efficiently improve the heat transfer between the high-side MOS transistor H1 and MOS transistor H2 by positionally approximating them to the center. The 6in1-configuration control module 60 according to the third embodiment can efficiently improve the heat transfer between the MOS transistors H1 to H3 by positionally approximating the high-side MOS transistor H1 and MOS transistor H3 to the center.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
a plurality of control modules that controls a rotating electric machine;
a heat radiation plate on which each control module is disposed; and
an insulation layer disposed between each control module and the heat radiation plate so as to electrically isolate each control module from the heat radiation plate, wherein:
the plurality of control modules are circularly arranged around a rotary shaft of the rotating electric machine;
each control module includes at least two sets of arms, each set including a high-side switching element and a low-side switching element that provide an inverter;
the plurality of control modules are coupled in parallel to each other with respect to a bus bar coupled to one power source, and the at least two sets of arms are coupled in parallel to each other with respect to the bus bar;
each control module includes a metal plate on which the high-side switching element and the low-side switching element are mounted, the metal plate mediating an electric coupling with the power source;
each metal plate includes a first metal plate on which the high-side switching element in one set is disposed, a second metal plate on which the high-side switching element in another set is disposed, and a coupling plate that mutually, electrically and thermally couples the first metal plate and the second metal plate;
each control module is arranged to oppose the metal plate to the heat radiation plate via the insulation layer; and
the coupling plate is thicker than the insulation layer.

2. The semiconductor device according to claim 1, wherein:
each control module further includes a control IC that controls the high-side switching element and the low-side switching element; and
the control IC is disposed between low-side switching elements of the control modules in a direction along an alignment of the low-side switching elements.

3. The semiconductor device according to claim 1, wherein:
each control module includes two sets of arms having a first arm and a second arm;
the first arm includes a first high-side switching element and a first low-side switching element mounted on a same plane;
the second arm includes a second high-side switching element and a second low-side switching element mounted on a same plane; and
each control module includes:
a single positive electrode terminal that extends between the first high-side switching element and the second high-side switching element in a direction along an alignment of the first high-side switching element and the second high-side switching element, and is coupled to the bus bar; and
a single negative electrode terminal that extends between the first low-side switching element and the second low-side switching element in a direction along an alignment of the first low-side switching element and the second low-side switching element.

4. The semiconductor device according to claim 3, wherein:
the positive electrode terminal extends from a center in the direction along the alignment of the first high-side switching element and the second high-side switching element; and
the negative electrode terminal extends from a center in the direction along the alignment of the first low-side switching element and the second low-side switching element.

5. The semiconductor device according to claim 1, wherein:
each control module includes three sets of the arms having a first arm, a second arm and a third arm;
the first arm includes a first high-side switching element and a first low-side switching element mounted on a same plane;
the second arm includes a second high-side switching element and a second low-side switching element mounted on a same plane;

the third arm includes a third high-side switching element and a third low-side switching element mounted on a same plane;

the second arm is arranged between the first arm and the third arm on a mounting surface of each switching element in each control module;

the coupling plate mutually couples the first and second metal plates on which the first high-side switching element and the second high-side switching element are mounted; and the coupling plate mutually couples the second and third metal plates on which the second high-side switching element and the third high-side switching element are mounted.

6. The semiconductor device according to claim 5, wherein:

each control module further includes:

a single positive electrode terminal that extends from a center in a direction along alignment of the first high-side switching element and the third high-side switching element, and is coupled to the bus bar; and a single negative electrode terminal that extends from a center in a direction along an alignment of the first low-side switching element and the third low-side switching element, and is coupled to the bus bar.

7. The semiconductor device according to claim 5, wherein:

the second arm has a lower electric resistance than the first arm and the third arm.

8. The semiconductor device according to claim 7, wherein:

each switching element is a MOSFET; and at least one of the second high-side switching element and the second low-side switching element has an area of an effective cell region through which a drain current flows, the area being larger than another switching element providing the first arm or the third arm, and the second arm has a lower electric resistance than the first arm and the third arm.

* * * * *